US011735454B2

(12) United States Patent
Kobayashi et al.

(10) Patent No.: US 11,735,454 B2
(45) Date of Patent: Aug. 22, 2023

(54) TRANSFER DEVICE AND CEILING CARRIER

(71) Applicant: MURATA MACHINERY, LTD., Kyoto (JP)

(72) Inventors: Makoto Kobayashi, Ise (JP); Keiichiro Suriki, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 93 days.

(21) Appl. No.: 17/433,064

(22) PCT Filed: Dec. 20, 2019

(86) PCT No.: PCT/JP2019/050215
§ 371 (c)(1),
(2) Date: Aug. 23, 2021

(87) PCT Pub. No.: WO2020/174846
PCT Pub. Date: Sep. 3, 2020

(65) Prior Publication Data
US 2022/0157631 A1     May 19, 2022

(30) Foreign Application Priority Data

Feb. 26, 2019   (JP) ................................ 2019-033197

(51) Int. Cl.
*H01L 21/677*   (2006.01)
(52) U.S. Cl.
CPC .... *H01L 21/67769* (2013.01); *H01L 21/6773* (2013.01); *H01L 21/67724* (2013.01)

(58) Field of Classification Search
CPC ......... H01L 21/67724; H01L 21/67769; H01L 21/6773; B65G 2201/0297
See application file for complete search history.

(56) References Cited

U.S. PATENT DOCUMENTS

| | | | |
|---|---|---|---|
| 2007/0043484 A1* | 2/2007 | Moriguchi | G05B 19/416 |
| | | | 701/25 |
| 2017/0137240 A1 | 5/2017 | Tsuji et al. | |
| 2017/0243775 A1 | 8/2017 | Kobayashi | |

FOREIGN PATENT DOCUMENTS

| | | | |
|---|---|---|---|
| CN | 107055013 A | | 8/2017 |
| JP | 09272605 A | * | 10/1997 |

(Continued)

OTHER PUBLICATIONS

Official Communication issued in corresponding European Patent Application No. 19916875.8, dated Oct. 14, 2022.

*Primary Examiner* — Glenn F Myers
(74) *Attorney, Agent, or Firm* — Keating & Bennett, LLP

(57) ABSTRACT

A transfer device includes a controller configured or programmed to perform at least one of a first control to make a maximum acceleration when moving a FOUP to a front end side smaller than a maximum acceleration when moving to a back end side, a second control to make a maximum deceleration when moving the FOUP to the front end side greater than a maximum deceleration when moving to the back end side, a third control to make the absolute value of the maximum deceleration when moving the FOUP to the front end side greater than the absolute value of the maximum acceleration, and a fourth control to make the absolute value of the maximum acceleration when moving the FOUP to the back end side greater than the absolute value of the maximum deceleration.

13 Claims, 7 Drawing Sheets

(56) References Cited

FOREIGN PATENT DOCUMENTS

| JP | 2000-038218 A |   | 2/2000 |
|----|---------------|---|--------|
| JP | 2001088909 A  | * | 4/2001 |
| JP | 2017-145134 A |   | 8/2017 |

* cited by examiner

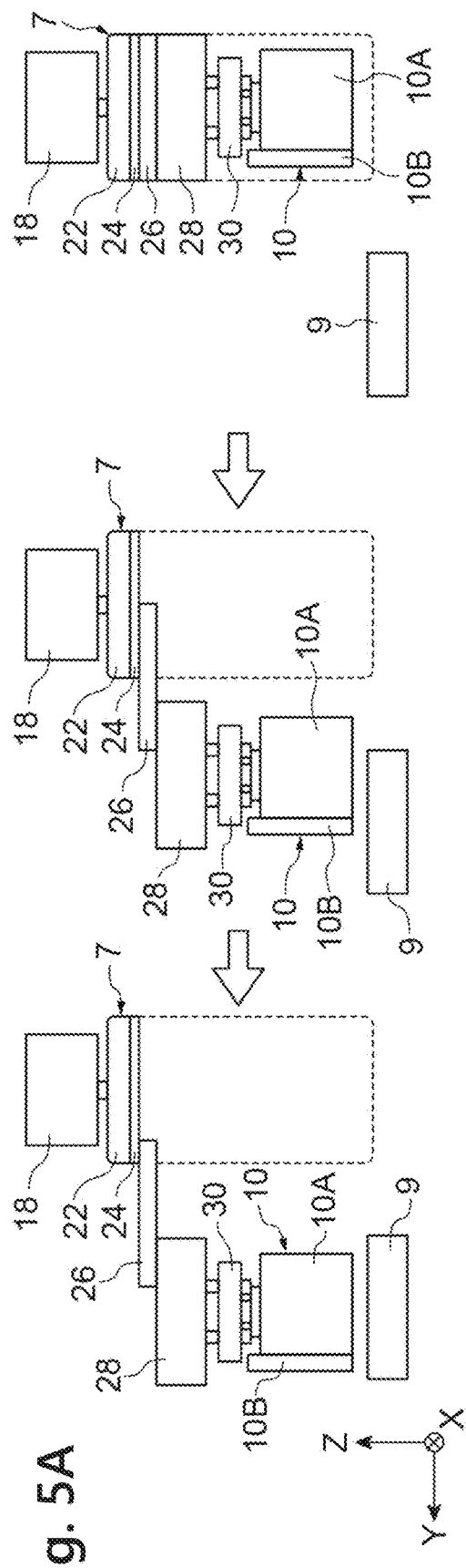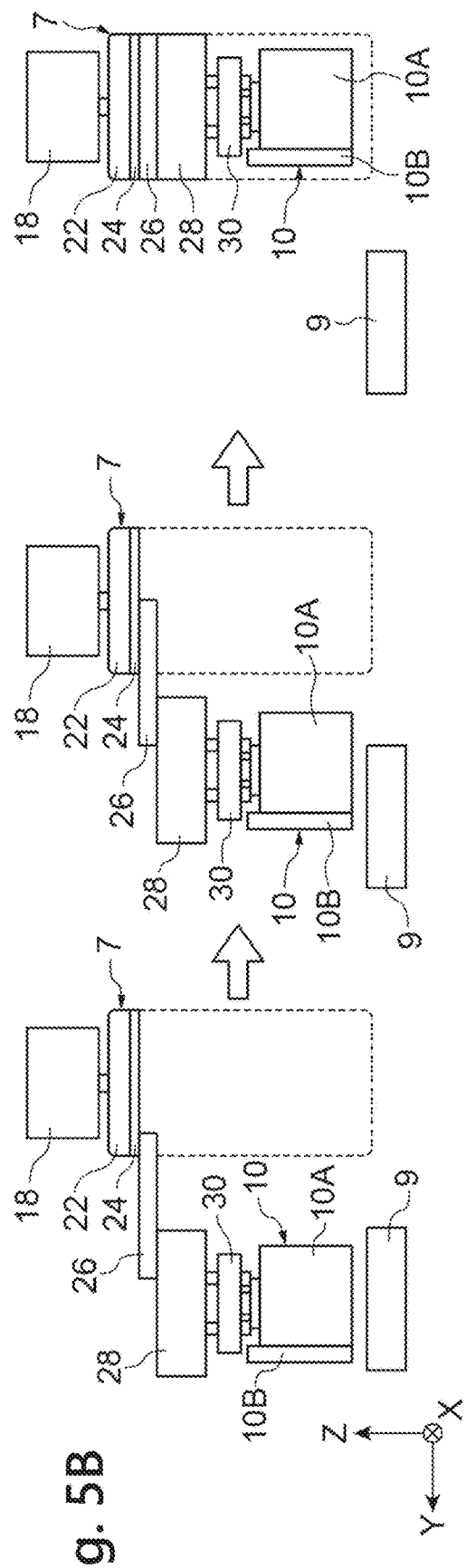

TRANSFER DEVICE AND CEILING CARRIER

BACKGROUND OF THE INVENTION

1. Field of the Invention

An aspect of the present invention relates to a transfer device and an overhead transport vehicle.

2. Description of the Related Art

An overhead transport vehicle having a transfer device that transfers an article to a placement section such as a buffer for temporarily placing an article and a delivery port for delivering an article to/from a variety of processing devices is known. For example, Japanese Unexamined Patent Publication No. 2017-145134 discloses an overhead transport vehicle having a transfer device that holds a FOUP by supporting the flange of the FOUP from below.

SUMMARY OF THE INVENTION

In recent years, articles to be transported have been diversified, and there are many objects whose center of gravity in the article transfer direction deviates from the center position of the articles. When such an article accelerates or decelerates in a state in which a portion of the article is supported from below, a moment is exerted on the article, and the back end or the front end in the transfer direction of the article is sometimes lifted up. Tilting or swaying of the article due to the lifting-up may lead to dropping of the article or collision of the article with a portion of the overhead transport vehicle.

Preferred embodiments of the present invention provide transfer devices and overhead transport vehicles capable of reducing or preventing lifting-up when an article is transferred in a state in which a portion of the article is supported from below.

A transfer device according to an aspect of a preferred embodiment of the present invention moves an article along one direction and supports the article from below. The article has a center of gravity position deviating from a center position between a first end and a second end in the one direction to the first end side. The transfer device includes a controller configured or programmed to perform at least one of a first control, a second control, a third control, and a fourth control.

The first control is a control to make a maximum acceleration when moving the article to the first end side smaller than a maximum acceleration when moving the article to the second end side.

The second control is a control to make a maximum deceleration when moving the article to the first end side greater than a maximum deceleration when moving the article to the second end side.

The third control is a control to make an absolute value of the maximum deceleration when moving the article to the first end side greater than an absolute value of the maximum acceleration.

The fourth control is a control to make an absolute value of the maximum acceleration when moving the article to the second end side greater than an absolute value of the maximum deceleration.

The inventors of the present application have discovered states of the article to be moved in the horizontal direction in a state in which a portion of the article having the unbalanced center of gravity is supported from below.

(1) When the Direction of the Unbalanced Center of Gravity (Hereinafter Referred to as "Off-Center Direction") Coincides with the Moving Direction In this case, if the article accelerates in the moving direction, the inertial force due to the acceleration will increase the force of the gravity to tilt the first end side downward. This brings about a state in which the first end side sinks and the second end side is easily lifted up (hereinafter simply referred to as "lifting-up") (first state). Furthermore, if the article decelerates in the moving direction, the inertial force due to the deceleration will cancel the force of the gravity to tilt the first end side downward. This brings about a state in which lifting-up is less likely to occur compared with the first state (second state).

(2) When the Off-Center Direction is the Direction Opposite to the Moving Direction In this case, if the article decelerates in the moving direction, the inertial force due to the deceleration will increase the force due to gravity to tilt to the first end side. This brings about a state in which lifting-up is likely to occur (third state). On the other hand, if the article accelerates in the moving direction, the inertial force due to the acceleration will cancel the force due to gravity to tilt to the first end side. This brings about a state in which lifting-up is less likely to occur compared with the third state (fourth state).

In this configuration of the transfer device, the first control and the third control can be performed so that the lifting-up as in the first state is less likely to occur. Furthermore, the second control and the fourth control can be performed so that the lifting-up as in the third state is less likely to occur. In a configuration according to an aspect of a preferred embodiment of the present invention, since at least one of the controls described above is performed, lifting-up can be reduced or prevented when an article is transferred in a state in which a portion of the article is supported from below.

In a transfer device according to an aspect of a preferred embodiment of the present invention, the controller may be configured or programmed to perform both of the first control and the second control. In this configuration, the first control can be performed so that the lifting-up as in the first state is less likely to occur. Furthermore, the second control can be performed so that the lifting-up as in the third state is less likely to occur. With this configuration, lifting-up can be reduced or prevented when an article is transferred in a state in which a portion of the article is supported from below.

In a transfer device according to an aspect of a preferred embodiment of the present invention, the controller may be configured or programmed to perform both of the third control and the fourth control. In this configuration, the third control can be performed so that the lifting-up as in the first state is less likely to occur. Furthermore, the fourth control can be performed so that the lifting-up as in the third state is less likely to occur. With this configuration, lifting-up can be reduced or prevented when an article is transferred in a state in which a portion of the article is supported from below.

In a transfer device according to an aspect of a preferred embodiment of the present invention, the controller may be configured or programmed to perform all of the first control, the second control, the third control, and the fourth control. In this configuration, the first control and the third control can be performed so that the lifting-up as in the first state is less likely to occur. Furthermore, the second control and the fourth control can be performed so that the lifting-up as in the third state is less likely to occur. In a configuration according to an aspect of a preferred embodiment of the present invention, since all of the controls described above are able to be performed, lifting-up can be reduced or prevented more effectively when an article is transferred in a state in which a portion of the article is supported from below.

In an overhead transport vehicle according to an aspect of a preferred embodiment of the present invention, the article may be a container including a body opening toward the first end side, a cover to cover the opening, and a flange at an upper portion of the body. The overhead transport vehicle may include the transfer device described above further including a holding portion to hold the flange supported from below, and a traveler to travel on a track supported by a ceiling. In a configuration according to an aspect of a preferred embodiment of the present invention, lifting-up can be reduced or prevented when an article is transferred in a state in which a portion of the article is supported from below.

An overhead transport vehicle according to an aspect of the present invention may further include a biasing member to urge an upper portion of the flange. In this configuration, the lifting-up can be reduced or prevented without impairing the function of the biasing member provided to reduce transmission of vibration to an article during moving, that is, without pushing the flange hard.

An aspect of a preferred embodiment of the present invention can reduce or prevent lifting-up when an article is transferred in a state in which a portion of the article is supported from below.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5A is a diagram illustrating an example of operation when the transfer device places a FOUP onto the placement section on the left side, and FIG. 5B is a diagram illustrating operation when the transfer device moves a FOUP from the placement section on the left side.

DETAILED DESCRIPTION OF THE PREFERRED EMBODIMENTS

Preferred embodiments of the present invention will be described in detail below with reference to the drawings. In the description of the drawings, the same elements are denoted by the same reference signs and an overlapping description is omitted.

Figure 1:
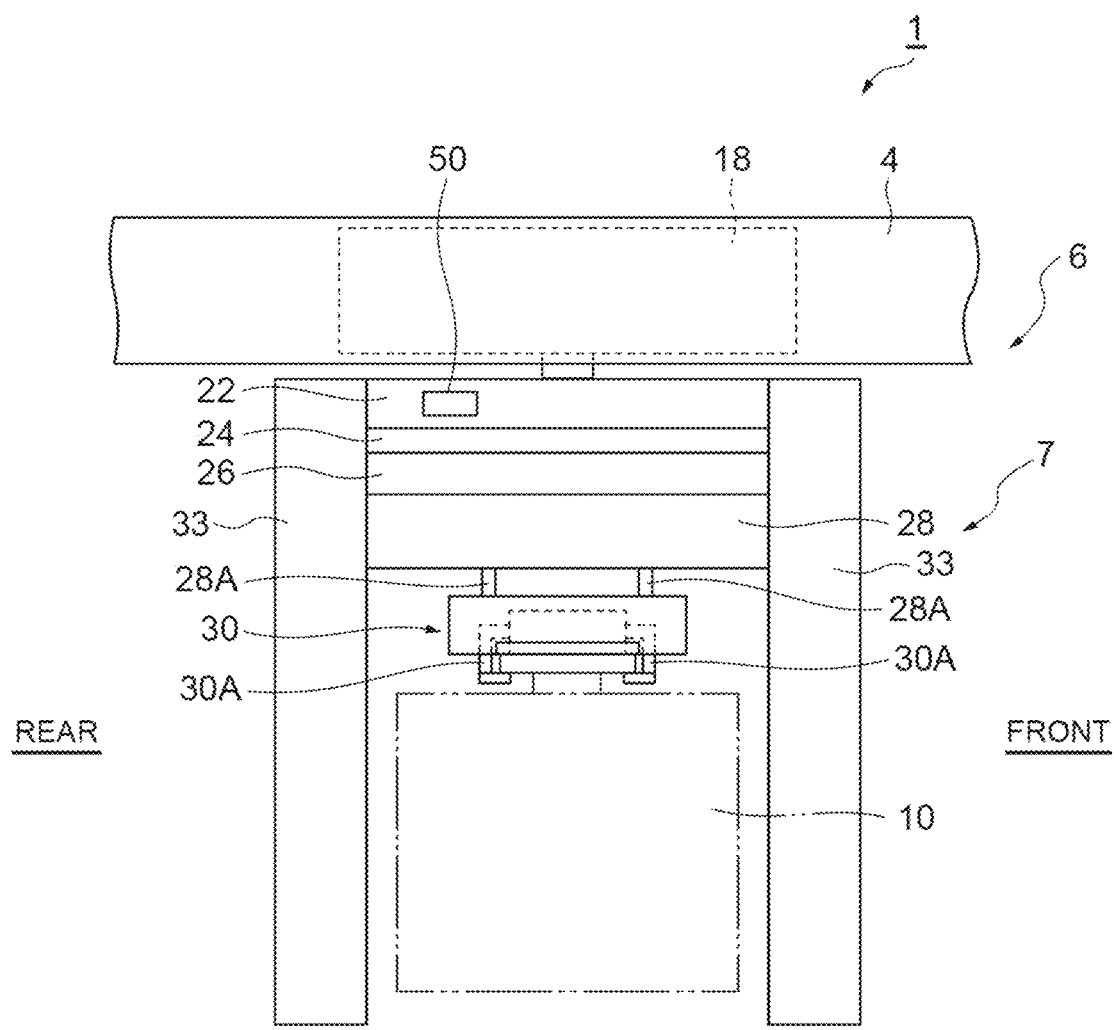
FIG. 1 is a side view illustrating an overhead transport vehicle including a transfer device according to a preferred embodiment of the present invention.
Figure 4:
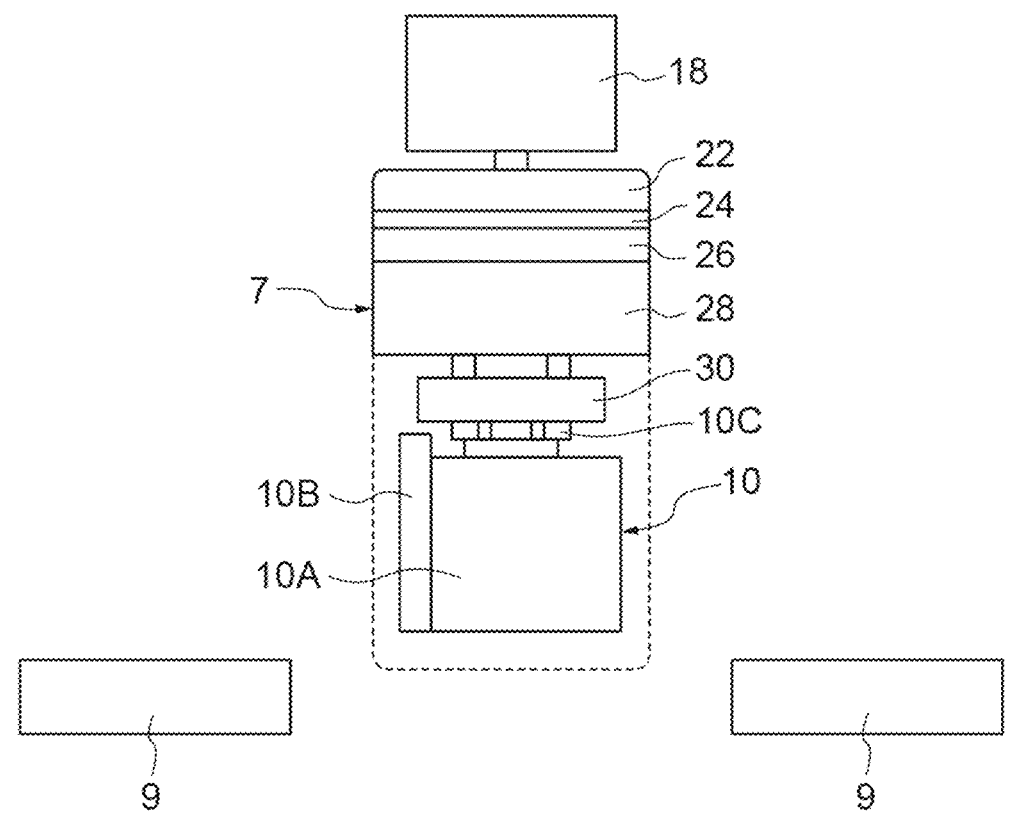
FIG. 4 is a diagram illustrating placement sections disposed on both sides of the overhead transport vehicle as viewed from the rear side in the traveling direction of the overhead transport vehicle.

As illustrated in FIG. 1, an overhead transport vehicle 6 according to a preferred embodiment is an overhead transport vehicle capable of moving along a track 4 and usable in a system to transport a front opening unified pod (FOUP) (article) 10 between placement sections 9 (see FIG. 4). The overhead transport vehicle 6 may transport, for example, a container storing a plurality of glass substrates, a container such as a reticle pod, and common parts, instead of the FOUP 10. Here, for example, the overhead transport vehicle 6 for use in an overhead transport vehicle system 1 is taken as an example, in which the overhead transport vehicle 6 travels along the one-way track 4 laid on a ceiling in a factory, for example. As illustrated in FIG. 1, the overhead transport vehicle system 1 includes the track 4, a plurality of placement sections 9, and a plurality of overhead transport vehicles 6.

Figure 2:
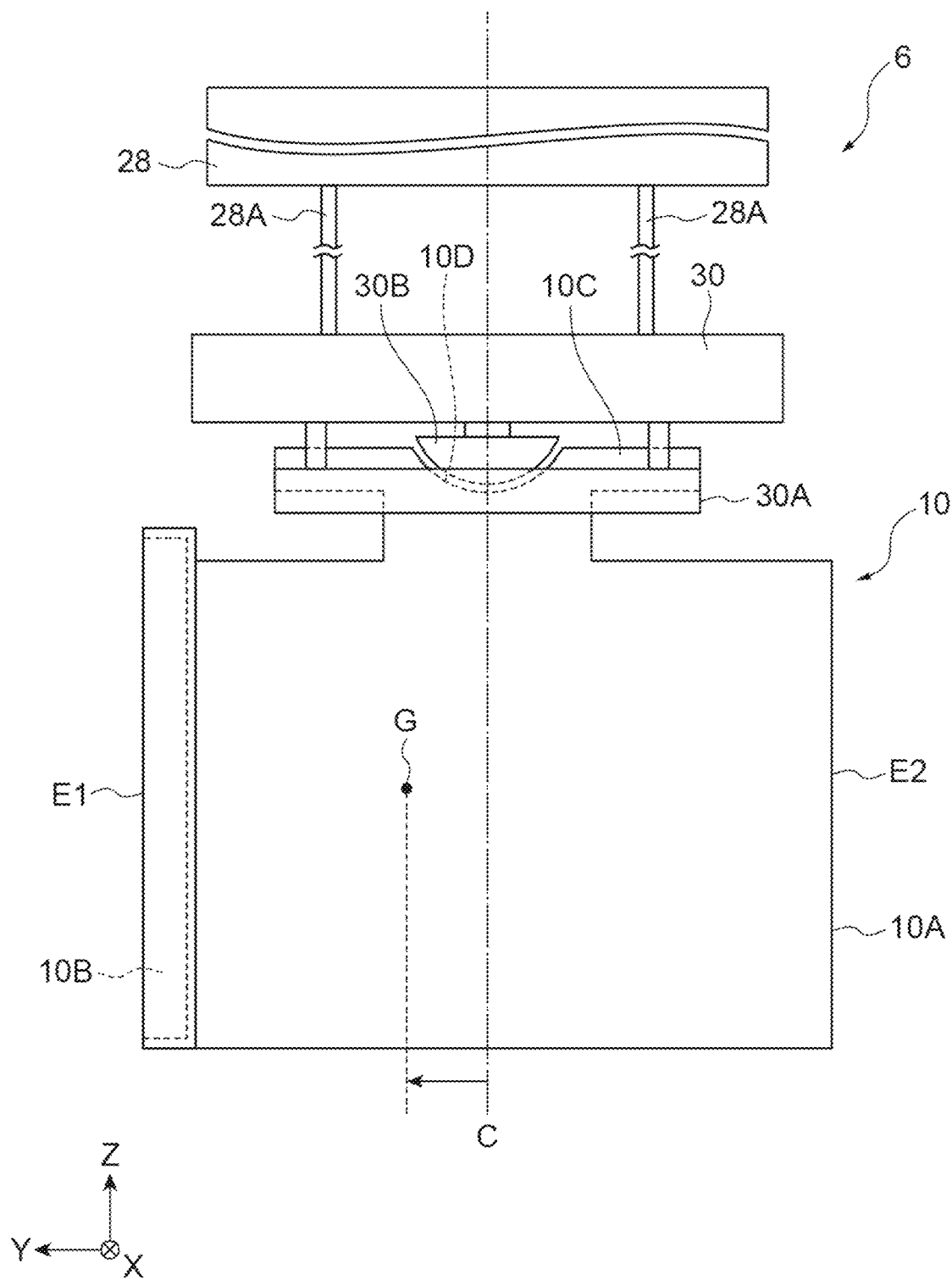
FIG. 2 is a front view illustrating the transfer device in FIG. 1 holding a FOUP.

The FOUP 10 transported by the overhead transport vehicle 6 will be described. As illustrated in FIG. 2, the FOUP 10 includes a body 10A with an opening on a front end (first end) E1 side and a cover 10B attached to the front end that is the opening of the body 10A. At the substantially central portion of the upper surface (upper portion) of the body 10A, a flange 10C to hold the FOUP 10 protrudes upward. A plurality of not-illustrated semiconductor wafer holders are provided in the inside of the body 10A so that a plurality of semiconductor wafers can be accommodated in the FOUP 10. The cover 10B is attached to the opening to keep the inside of the FOUP 10 airtight.

The cover 10B of the FOUP 10 in the present preferred embodiment has a relatively large mass since parts such as a not-illustrated lock mechanism are fixed thereto. In a state in which the cover 10B is attached to the body 10A, therefore, the center of gravity position G in the left-right direction of the FOUP 10 (one direction: a direction orthogonal to the cover 10B) deviates to the left side (the cover 10B side), that is, the front end E1 side of the FOUP 10, compared with the center position C of the flange 10C in the left-right direction. The center portion of the upper surface of the flange 10C has a depression 10D in which a center cone (biasing member) 30B described in detail later is engaged (fitted).

The track 4 is laid, for example, in the vicinity of the ceiling that is a space above the worker's head. The track 4 is, for example, suspended from the ceiling. The track 4 is a predetermined traveling path for the overhead transport vehicle 6 to travel.

As illustrated in FIG. 4, the placement sections 9 are disposed along the track 4 and provided at positions where the FOUP 10 can be delivered to/from the overhead transport vehicle 6. The placement sections 9 include a buffer and a delivery port. The buffer is a placement section on which the FOUP 10 is temporarily placed. The buffer is a placement section on which the FOUP 10 is temporarily placed when the FOUP 10 transported by the overhead transport vehicle 6 is unable to be transferred to a target delivery port, for example, for the reason that another FOUP 10 is placed on the target delivery port. The delivery port is, for example, a placement section to deliver the FOUP 10 to a semiconductor processing device (not illustrated) such as a cleaning device, a deposition device, a lithography device, an etching device, a thermal treatment device, and a planarization device. The processing device is not limited to a specific device and may be a variety of devices.

For example, the placement sections 9 are disposed to the side (the left and right sides as viewed from the traveling direction) of the track 4. In this case, the overhead transport vehicle 6 allows a traverse unit 24 to traverse an elevation drive unit 28 and the like in the left direction or the right direction and slightly elevates and lowers an elevation stage 30 to deliver the FOUP 10 to/from the placement section 9. Although not illustrated, the placement sections 9 may be arranged immediately below the track 4. In this case, the overhead transport vehicle 6 elevates and lowers the elevation stage 30 to deliver the FOUP 10 to/from the placement section 9. The operation of transferring the FOUP 10 to the placement section 9 by a transfer device 7 will be described in detail later.

The overhead transport vehicle 6 travels along the track 4 and transports the FOUP 10. The overhead transport vehicle 6 is an automated overhead transport vehicle. The number of overhead transport vehicles 6 included in the overhead transport vehicle system 1 is not limited and is more than one. As illustrated in FIG. 1 and FIG. 2, the overhead transport vehicle 6 includes a traveling unit 18, the transfer device 7, and a controller 50.

The traveling unit 18 includes a motor and allows the overhead transport vehicle 6 to travel along the track 4. The transfer device 7 includes a body frame 22, the traverse unit 24, a θ drive 26, the elevation drive unit 28, the elevation stage 30, and front and rear frames 33 and 33.

The body frame 22 supports the traverse unit 24, the θ drive 26, the elevation drive unit 28, and the elevation stage 30. The traverse unit 24 collectively traverses the θ drive 26, the elevation drive unit 28, and the elevation stage 30 in a direction normal to the traveling direction of the track 4. The θ drive 26 turns at least one of the elevation drive unit 28 and the elevation stage 30 within a predetermined angle range in a horizontal plane. The elevation drive unit 28 elevates and lowers the elevation stage 30 by reeling or unreeling a suspension member 28A such as a wire, a rope, or a belt.

The elevation stage 30 includes a chuck (holding portion) 30A and a center cone (biasing member) 30B. The chuck 30A holds the flange 10C of the FOUP 10 supported from below. The chuck 30A can freely hold or release the FOUP 10. The center cone 30B is fitted in the depression 10D of the flange 10C to position the elevation stage 30 with respect to the flange 10C. The center cone 30B is configured to urge the flange 10C of the FOUP 10 from above and is configured to reduce transmission of vibration to the FOUP 10 during moving through the center cone 30B. The front and rear frames 33 and 33 provide a not-illustrated pawl to prevent the FOUP 10 from dropping during transportation. The front and rear frames 33 and 33 are provided at the front and the rear in the traveling direction of the overhead transport vehicle 6.

Figure 3:
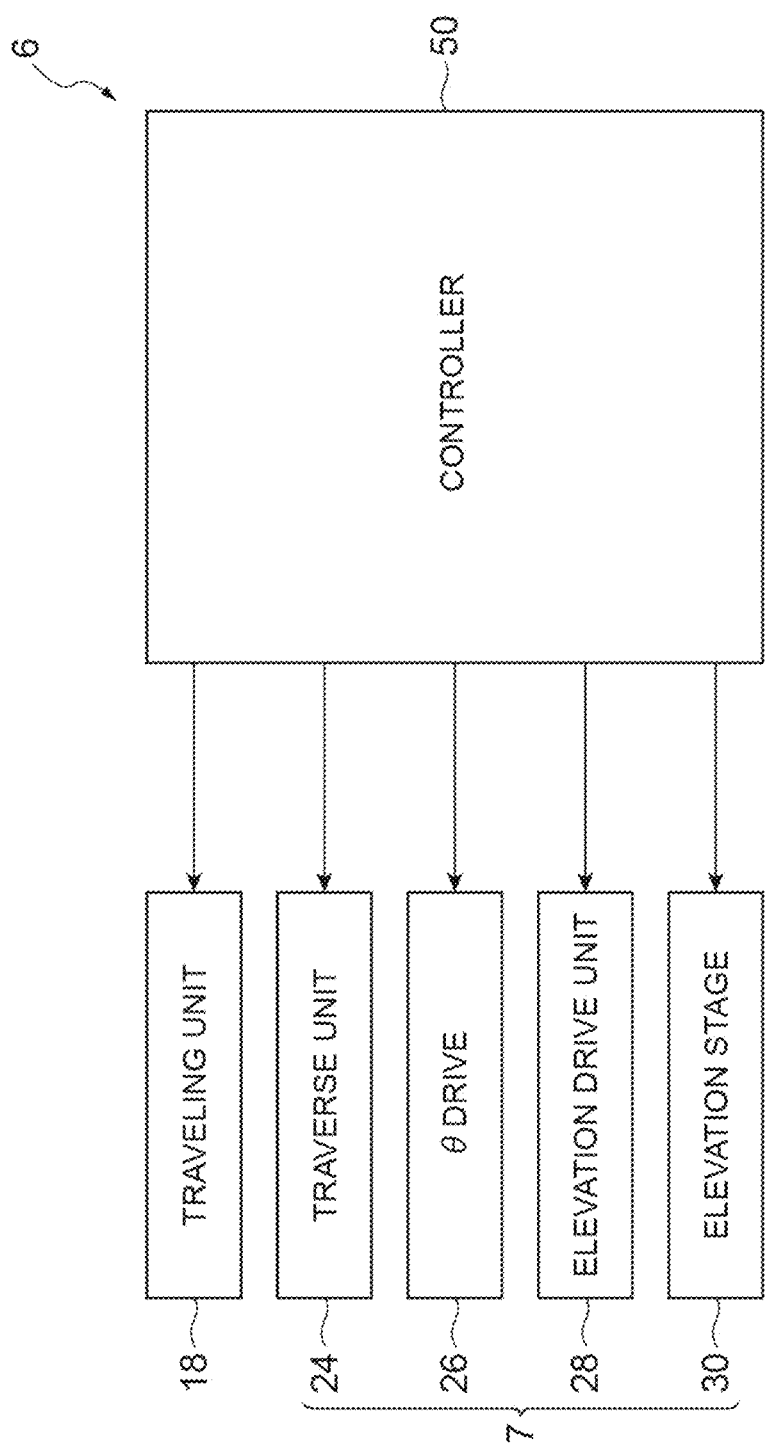
FIG. 3 is a block diagram illustrating a functional configuration of the overhead transport vehicle in FIG. 1.

The controller 50 is an electronic control unit including a central processing unit (CPU), a read only memory (ROM), and a random access memory (RAM). The controller 50 is configured or programmed to control various operations in the overhead transport vehicle 6 (specifically, the traveling unit 18 and the transfer device 7). Specifically, as illustrated in FIG. 3, the controller 50 is configured or programmed to control the traveling unit 18, the traverse unit 24, the θ drive 26, the elevation drive unit 28, and the elevation stage 30. The controller 50 can be configured, for example, as software that is a program stored in the ROM, loaded into the RAM, and executed by the CPU. The controller 50 may be configured as hardware with electronic circuitry, for example. In the controller 50, hardware such as the CPU, the RAM, and the ROM and software such as a program cooperate to perform, for example, at least one of first control to fourth control described below.

Figure 7A:
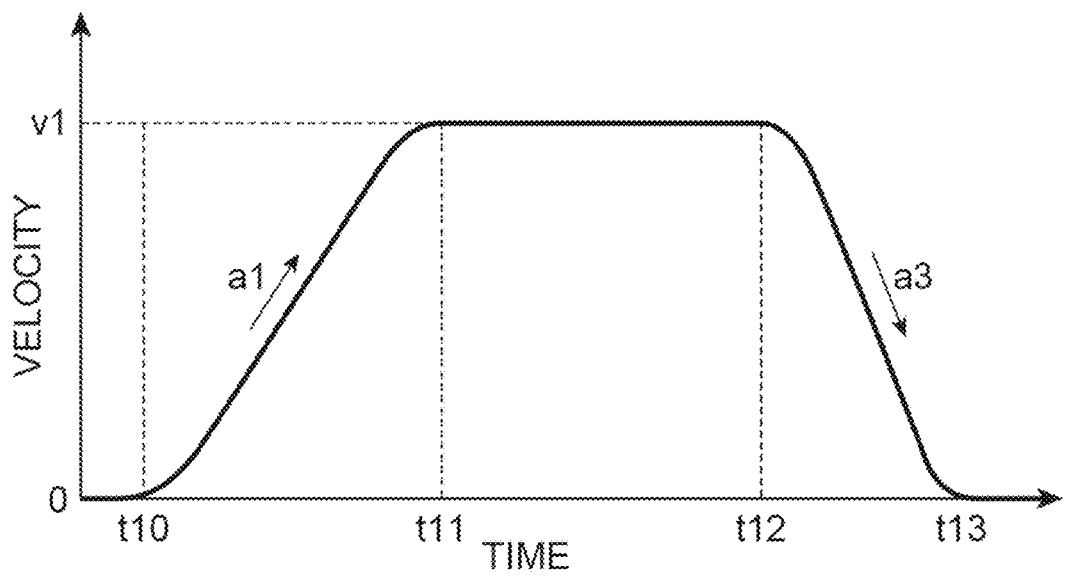
FIG. 7A is a v-t graph when the transfer device moves a FOUP to the front end side.
Figure 7B:
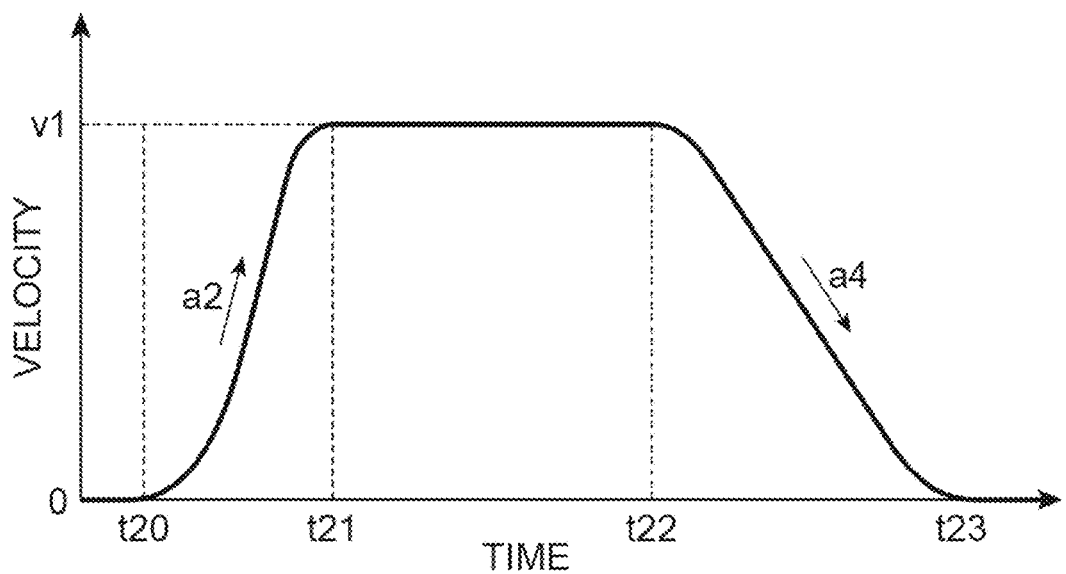
FIG. 7B is a v-t graph when the transfer device moves a FOUP to the back end side.

The first control to the fourth control performed by the controller 50 will now be described with reference to FIGS. 7A and 7B. FIG. 7A is a v-t graph when the transfer device 7 moves the FOUP 10 to the front end E1 side, and FIG. 7B is a v-t graph when the transfer device 7 moves the FOUP 10 to the back end E2 (second end) side.

(1) First Control

The first control is control to make a maximum acceleration when moving the FOUP 10 to the front end E1 side smaller than a maximum acceleration when moving the FOUP 10 to the back end E2 side. Specifically, the controller 50 controls the traverse unit 24 such that a maximum acceleration a1 at the start of moving in the front end E1 side direction by the traverse unit 24 is smaller than a maximum acceleration a2 at the start of moving in the back end E2 side direction. As used herein, the start of moving refers to a period of time from initial velocity of zero to feeding at uniform velocity v1. Specifically, it refers to a period of time from t10 to t11 in the v-t graph illustrated in FIG. 7A or a period of time from t20 to t21 illustrated in FIG. 7B.

(2) Second Control

The second control is control to make a maximum deceleration when moving the FOUP 10 to the front end E1 side greater than a maximum deceleration when moving the FOUP 10 to the back end E2 side. Specifically, the controller 50 controls the traverse unit 24 such that a maximum deceleration a3 at the end of moving in the front end E1 side direction by the traverse unit 24 is greater than a maximum deceleration a4 at the end of moving in the back end E2 side direction. As used herein, the end of moving refers to a period of time taken from uniform velocity v1 to moving velocity of zero. Specifically, it refers to a period of time from t12 to t13 in the v-t graph illustrated in FIG. 7A or a period of time from t22 to t23 illustrated in FIG. 7B.

(3) Third Control

The third control is control to make the absolute value of the maximum deceleration when moving the FOUP 10 to the front end E1 side greater than the absolute value of the maximum acceleration. Specifically, when moving the FOUP 10 to the front end E1 side, as illustrated in FIG. 7A, the controller 50 controls the traverse unit 24 such that the absolute value of the maximum deceleration a3 at the end of moving in the front end E1 direction by the traverse unit 24 is greater than the absolute value of the maximum acceleration a1 at the start of moving.

(4) Fourth Control

The fourth control is control to make the absolute value of the maximum acceleration when moving the FOUP 10 to the back end E2 side greater than the absolute value of the maximum deceleration. Specifically, when moving the FOUP 10 to the back end E2 side, as illustrated in FIG. 7B, the controller 50 controls the traverse unit 24 such that the absolute value of the maximum acceleration a2 at the start of moving in the back end E2 side direction by the traverse unit 24 is greater than the absolute value of the maximum deceleration a4 at the end of moving.

The operation of the transfer device 7 will now be described.

(A) Operation of the Transfer Device 7 placing the FOUP 10 onto the Placement Section 9 on the Left Side Mainly referring to FIG. 5A and FIG. 7A, the operation of the transfer device 7 placing the FOUP 10 onto the placement section 9 on the left side will be described. The operation described here is the operation of moving the FOUP 10 to the front end E1 side. The traverse unit 24 starts moving in the left direction (t10 to t11). At this moment, the controller 50 controls the traverse by the traverse unit 24 such that the acceleration is gradually increased and kept for a while at the maximum acceleration a1 and thereafter the acceleration is gradually decreased. Subsequently, the traverse unit 24 moves at a constant velocity for a while (t11 to t12). The controller 50 performs control such that the acceleration at this point of time is kept at zero. Subsequently, the traverse unit 24 stops moving (t12 to t13). At this moment, the controller 50 controls the traverse by the traverse unit 24 such that the deceleration is gradually increased and kept for a while at the maximum deceleration a3 and thereafter the deceleration is gradually decreased. The controller 50 controls the traverse unit 24 such that the absolute value of the maximum deceleration a3 is greater than the absolute value of the maximum acceleration a1. In other words, in the present preferred embodiment, the time required for the start of moving (t10 to t11) is longer than the time required for the end of moving (t12 to t13).

(B) Operation of the Transfer Device 7 Moving the FOUP 10 from the Placement Section 9 on the Left Side Mainly referring to FIG. 5B and FIG. 7B, the operation of the transfer device 7 moving the FOUP 10 from the placement section 9 on the left side will be described. The operation described here is the operation of moving the FOUP 10 to the back end E2 side. The traverse unit 24 starts moving (t20 to t21). At this moment, the controller 50 controls the traverse by the traverse unit 24 such that the acceleration is gradually increased and kept for a while at the maximum acceleration a2 and thereafter the acceleration is gradually decreased. Subsequently, the traverse unit 24 moves at a constant velocity for a while (t21 to t22). The controller 50 performs control such that the acceleration at this point of time is kept at zero. Subsequently, the traverse unit 24 stops moving (t22 to t23). At this moment, the controller 50 controls the traverse by the traverse unit 24 such that the deceleration is gradually increased and kept for a while at the maximum deceleration a4 and thereafter the deceleration is gradually decreased. The controller 50 controls the traverse unit 24 such that the absolute value of the maximum acceleration a2 is greater than the absolute value of the maximum deceleration a4. In other words, in the present preferred embodiment, the time required for the start of moving (t20 to t21) is shorter than the time required for the end of moving (t22 to t23).

Figure 6A:
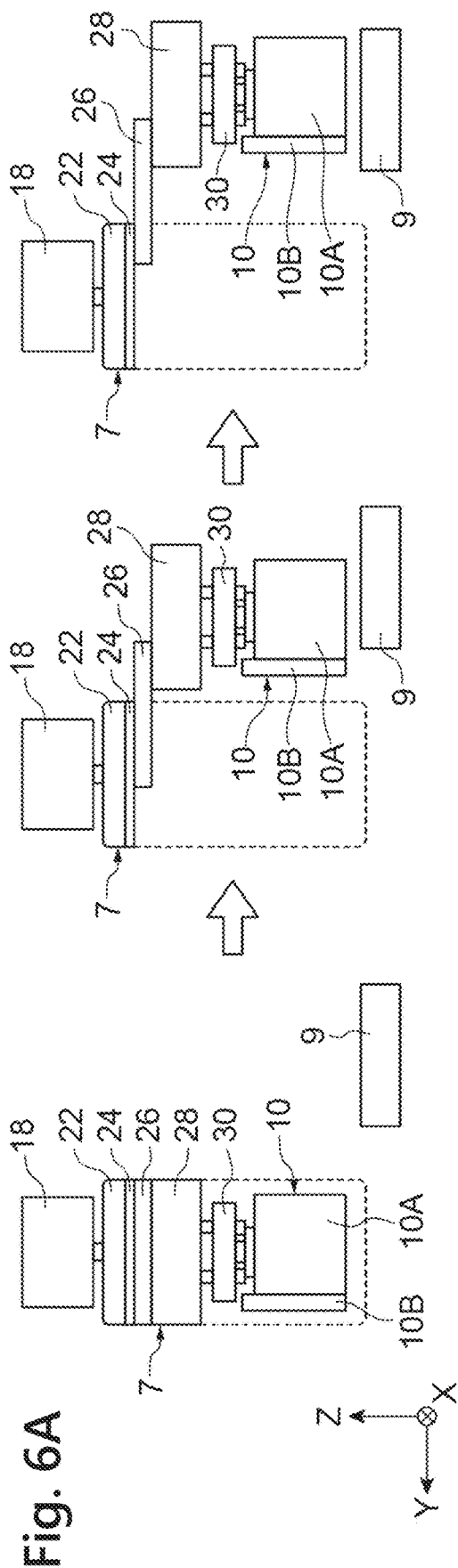
FIG. 6A is a diagram illustrating an example of operation when the transfer device places a FOUP onto the placement section on the right side.

(C) Operation when the Transfer Device 7 Places the FOUP 10 onto the Placement Section 9 on the Right Side The operation when the transfer device 7 places the FOUP 10 onto the placement section 9 on the right side illustrated in FIG. 6A is the same as (B) the operation of the transfer device 7 moving the FOUP 10 from the placement section 9 on the left side described above and is not further elaborated here.

Figure 6B:
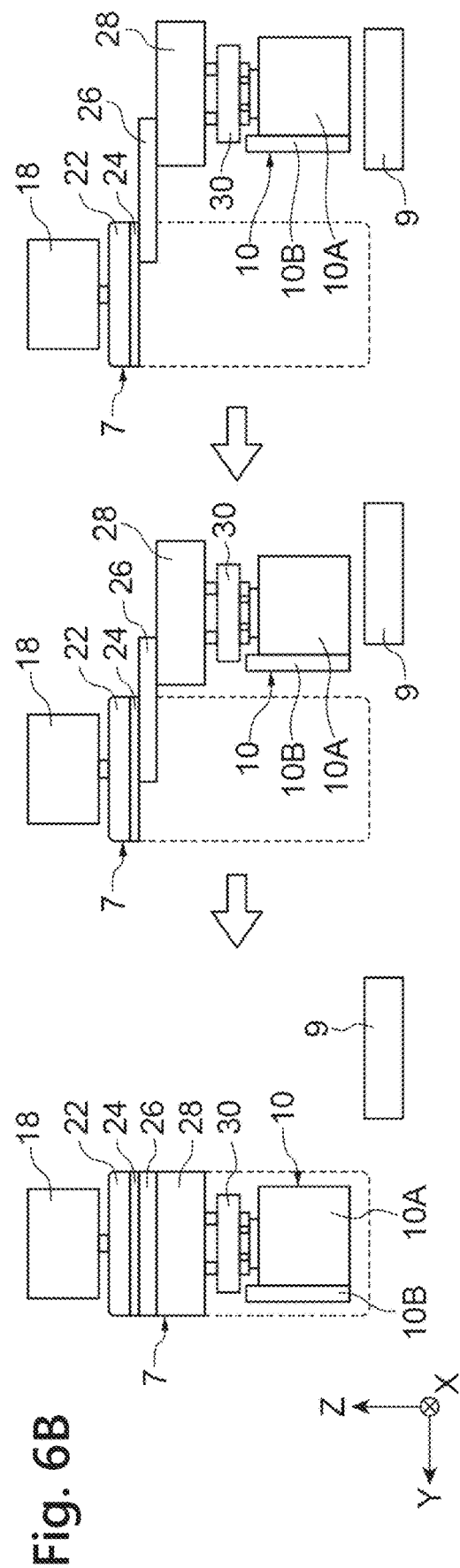
FIG. 6B is a diagram illustrating operation when the transfer device moves a FOUP from the placement section on the right side.

(D) Operation when the Transfer Device 7 Moves the FOUP from the Placement Section 9 on the Right Side The operation when the transfer device 7 moves the FOUP from the placement section 9 on the right side illustrated in FIG. 6B is the same as (A) the operation of the transfer device 7 placing the FOUP 10 onto the placement section 9 on the left side described above and is not further described here.

The operation effects of the overhead transport vehicle 6 in the foregoing preferred embodiment will now be described. In the overhead transport vehicle 6 in the foregoing preferred embodiment, the first control and the third control can be performed so that the lifting-up as in the first state is less likely to occur. Furthermore, the second control and the fourth control can be performed so that the lifting-up as in the third state is less likely to occur. In the overhead transport vehicle 6 in the foregoing preferred embodiment, since at least one of the first control to the fourth control is performed, lifting-up can be reduced or prevented when the FOUP 10 is transferred in a state in which a portion of the FOUP 10 is supported from below.

In addition, swaying of the FOUP 10 can be reduced or prevented by performing at least one of the first control to the fourth control. This control eliminates the need for taking measures, such as waiting until swaying of the FOUP 10 recedes, to perform the next operation. As a result, the time required to transfer the FOUP 10 can be reduced, and consequently, the operating rate of the overhead transport vehicle system 1 can be increased.

In the overhead transport vehicle 6 in the foregoing preferred embodiment, the center cone 30B fitted in the depression 10D of the flange 10C to position the elevation stage 30 with respect to the flange 10C is provided to reduce transmission of vibration to the FOUP 10 during moving. With such a configuration, swaying of the FOUP 10 can be reduced or prevented by allowing the center cone 30B to push the flange 10C hard (increasing a spring constant), but vibration is easily transmitted to the FOUP 10. In the overhead transport vehicle 6 in the foregoing preferred embodiment, since swaying of the FOUP 10 can be reduced by control of the traverse unit 24 in the controller 50, the center cone 30B need not have a function of pushing the flange 10C hard (a spring constant need not be increased), and vibration transmission through the center cone 30B can be reduced or minimized.

Although aspects and preferred embodiments of the present invention have been described above, other aspects and preferred embodiments of the present invention are not limited to the foregoing aspects and preferred embodiments and are amenable to various modifications without departing from the spirit of the present invention.

In the foregoing preferred embodiments, an example in which the controller 50 performs at least one of the first control to the fourth control has been described. However, for example, any two of the controls may be performed or three controls may be performed.

For example, the controller 50 may perform both of the first control and the second control. In this case, the first control can be performed so that the lifting-up as in the first state is less likely to occur. Furthermore, the second control can be performed so that the lifting-up as in the third state is less likely to occur. Alternatively, for example, the controller 50 may perform both of the third control and the fourth control. In this case, the third control can be performed so that the lifting-up as in the first state is less likely to occur. Furthermore, the fourth control can be performed so that the lifting-up as in the third state is less likely to occur. In these modifications, lifting-up can be reduced or prevented when the FOUP 10 is transferred in a state in which a portion of the FOUP 10 is supported from below.

Alternatively, for example, the controller 50 may perform all of the first control, the second control, the third control, and the fourth control. In this case, lifting-up can be reduced or prevented more effectively when the FOUP 10 is transferred in a state in which a portion of the FOUP 10 is supported from below.

In the foregoing preferred embodiments, an example in which the transfer device 7 is installed in the overhead transport vehicle 6 has been described. However, the transfer device 7 may be installed in an unmanned traveling vehicle or a stacker crane traveling on a track laid on the ground or a rack. Furthermore, the transfer device 7 may hold the FOUP 10 in such a manner as to support the lower surface of the FOUP 10 from below the FOUP 10, rather than holding the FOUP 10 in a suspending manner from above the FOUP 10 as described above.

In the foregoing preferred embodiments and modifications, examples in which the controller 50 controlling the overhead transport vehicle 6 is provided in each individual overhead transport vehicle 6 has been described. However, the controller 50 may be separated from the overhead transport vehicle 6 and disposed at a location where it can communicate by wire or by radio. In such a configuration, the controller may be provided as a controller that collectively controls a plurality of overhead transport vehicles 6, rather than being provided for each of a plurality of overhead transport vehicles 6.

In the foregoing preferred embodiments and modifications, examples in which a portion controlling the operation of the transfer device 7 is integrated with the controller controlling the operation of the entire overhead transport vehicle 6 has been described. However, controllers performing the respective controls may be provided separately.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transfer device to move an article along one direction and support the article from below, the article having a center of gravity position deviating from a center position between a first end and a second end in the one direction to the first end side, the transfer device comprising:
   a controller configured or programmed to perform at least one of:
      a first control to make a maximum acceleration when moving the article to the first end side smaller than a maximum acceleration when moving the article to the second end side;
      a second control to make a maximum deceleration when moving the article to the first end side greater than a maximum deceleration when moving the article to the second end side;
      a third control to make an absolute value of the maximum deceleration when moving the article to the first end side greater than an absolute value of the maximum acceleration; or
      a fourth control to make an absolute value of the maximum acceleration when moving the article to the second end side greater than an absolute value of the maximum deceleration; wherein
   the article is a container; and
   the controller is configured or programmed to selectively perform the at least one of the first control, the second control, the third control, or the fourth control based on whether the article is moved to the first end side or the second end side, and whether the article is moved onto or moved from a placement section.

2. The transfer device according to claim 1, wherein the controller is configured or programmed to perform both of the first control and the second control.

3. The transfer device according to claim 1, wherein the controller is configured or programmed to perform both of the third control and the fourth control.

4. The transfer device according to claim 1, wherein the controller is configured or programmed to perform all of the first control, the second control, the third control, and the fourth control.

5. An overhead transport vehicle comprising:
   the transfer device according to claim 1, further including a holding portion to hold the flange supported from below; and
   a traveler to travel on a track supported by a ceiling; wherein
   the container includes a body with an opening facing the first end side, a cover to cover the opening, and a flange at an upper portion of the body.

6. The overhead transport vehicle according to claim 5, further comprising a biasing member to urge an upper portion of the flange.

7. An overhead transport vehicle comprising:
   the transfer device according to claim 2, further including a holding portion to hold the flange supported from below; and
   a traveler to travel on a track supported by a ceiling; wherein
   the container includes a body with an opening facing the first end side, a cover to cover the opening, and a flange at an upper portion of the body.

8. The overhead transport vehicle according to claim 7, further comprising a biasing member to urge an upper portion of the flange.

9. An overhead transport vehicle comprising:
   the transfer device according to claim 3, further including a holding portion to hold the flange supported from below; and
   a traveler to travel on a track supported by a ceiling; wherein
   the container includes a body with an opening facing the first end side, a cover to cover the opening, and a flange at an upper portion of the body.

10. The overhead transport vehicle according to claim 9, further comprising a biasing member to urge an upper portion of the flange.

11. An overhead transport vehicle comprising:
    the transfer device according to claim 4, further including a holding portion to hold the flange supported from below; and
    a traveler to travel on a track supported by a ceiling; wherein
    the container includes a body with an opening facing the first end side, a cover to cover the opening, and a flange at an upper portion of the body.

12. The overhead transport vehicle according to claim 11, further comprising a biasing member to urge an upper portion of the flange.

13. The transfer device according to claim 1, wherein the controller is configured or programmed to perform:
    the first control, the second control, and the third control when the transfer device moves the article onto a placement section on the first end side;
    the first control, the second control, and the fourth control when the transfer device moves the article from the placement section on the first end side;
    the first control, the second control, and the fourth control when the transfer device moves the article onto a placement section on the second end side; or
    the first control, the second control, and the third control when the transfer device moves the article from the placement section on the second end side.

* * * * *